(12) United States Patent
Diana et al.

(10) Patent No.: US 10,237,980 B2
(45) Date of Patent: Mar. 19, 2019

(54) FLEXIBLE SUBSTRATE WITH CONDUCTIVE LAYER FOR MOUNTING LED ARRAYS

(71) Applicant: Lumileds LLC, San Jose, CA (US)

(72) Inventors: Frederic Stephane Diana, Santa Clara, CA (US); Patrick Allen Bournes, Santa Clara, CA (US); Walter Daeschner, San Jose, CA (US); Yong Seok Choi, Cupertino, CA (US); Axel Mehnert, Mountain View, CA (US); Mohiuddin Mala, San Jose, CA (US)

(73) Assignee: Lumileds LLC, San Jose, CA (US)

(*) Notice: Subject to any disclaimer, the term of this patent is extended or adjusted under 35 U.S.C. 154(b) by 206 days.

(21) Appl. No.: 15/103,991

(22) PCT Filed: Dec. 16, 2014

(86) PCT No.: PCT/IB2014/066942
§ 371 (c)(1),
(2) Date: Jun. 13, 2016

(87) PCT Pub. No.: WO2015/092666
PCT Pub. Date: Jun. 25, 2015

(65) Prior Publication Data
US 2017/0006710 A1 Jan. 5, 2017

Related U.S. Application Data

(60) Provisional application No. 61/917,540, filed on Dec. 18, 2013.

(51) Int. Cl.
*H05K 1/18* (2006.01)
*H05K 3/30* (2006.01)
(Continued)

(52) U.S. Cl.
CPC ........... *H05K 3/303* (2013.01); *H05K 1/0293* (2013.01); *H05K 3/04* (2013.01); *H01L 25/0753* (2013.01);
(Continued)

(58) Field of Classification Search
CPC ...... H05K 3/303; H05K 3/305; H05K 1/0293; H05K 1/189; H05K 2201/0909;
(Continued)

(56) References Cited

U.S. PATENT DOCUMENTS 4,081,898 A * 4/1978 Taylor, Jr. ............. G06F 3/0202
174/254
4,829,404 A 5/1989 Jensen
(Continued)

FOREIGN PATENT DOCUMENTS

WO 2013175261 A1 11/2013

OTHER PUBLICATIONS

EPO as ISA, International Search Report and Written Opinion dated May 18, 2015 from International Application No. PCT/IB2014/066942, filed Dec. 16, 2014, 10 pages.

*Primary Examiner* — Minh Trinh
(74) *Attorney, Agent, or Firm* — Volpe and Koenig PC

(57) ABSTRACT

A patterned conductive layer on a flexible substrate includes pads for mounting an array of LEDs, conductive strips, and conductive tabs that couple the conductive strips to the pads. The desired circuit configuration is created by removing select tabs by punching holes or otherwise piercing the flexible substrate at the location of the tabs. In some embodiments, the patterned conductive layer is arranged to permit each LED to be mounted in either of two mirrored orientations, and in some embodiments, the patterned conductive layer is arranged to permit a separation between LEDs that is not predefined by the pattern. In some embodiments, the
(Continued)

unmodified patterned conductive layer is arranged to provide a parallel circuit configuration, and the modified patterned conductive layer is arranged to provide a series or series-parallel configuration.

8 Claims, 3 Drawing Sheets

(51) Int. Cl.
 *H05K 1/02*    (2006.01)
 *H05K 3/04*    (2006.01)
 *H05K 3/00*    (2006.01)
 *H01L 25/075*   (2006.01)
 *H01L 33/62*    (2010.01)

(52) U.S. Cl.
 CPC ...... *H01L 33/62* (2013.01); *H01L 2924/0002* (2013.01); *H05K 1/189* (2013.01); *H05K 3/005* (2013.01); *H05K 2201/0909* (2013.01); *H05K 2201/10106* (2013.01); *H05K 2203/175* (2013.01)

(58) Field of Classification Search
 CPC ......... H01L 2924/0002; H01L 2924/00; H01L 25/0753; H01L 33/62
 See application file for complete search history.

(56) References Cited

U.S. PATENT DOCUMENTS

| | | | |
|---|---|---|---|
| 5,112,230 A | 5/1992 | Desimone | |
| 5,876,427 A * | 3/1999 | Chen | A61N 5/0601 |
| | | | 257/E25.021 |
| 7,600,136 B2 * | 10/2009 | Cheng | G06F 1/3203 |
| | | | 713/300 |
| 7,604,377 B2 * | 10/2009 | Yu | H05K 1/0274 |
| | | | 362/249.02 |
| 9,508,905 B2 * | 11/2016 | Lechleiter | H05K 1/183 |
| 9,541,269 B2 * | 1/2017 | Libon | F21V 31/04 |
| 2003/0137839 A1 * | 7/2003 | Lin | H05K 1/189 |
| | | | 362/237 |
| 2014/0226346 A1 * | 8/2014 | Kobayashi | H05K 1/0274 |
| | | | 362/382 |
| 2017/0006710 A1 * | 1/2017 | Diana | H05K 1/0293 |
| 2017/0125651 A1 * | 5/2017 | Kishikawa | H01L 33/56 |

* cited by examiner

FLEXIBLE SUBSTRATE WITH CONDUCTIVE LAYER FOR MOUNTING LED ARRAYS

CROSS-REFERENCE TO RELATED APPLICATIONS

The present application is a § 371 application of International Application No. PCT/IB2014/066942 filed on Dec. 16, 2014 and entitled "FLEXIBLE SUBSTRATE WITH ADAPTABLE PARAMETERS FOR INTEGRATED LED ARRAYS," which claims priority to U.S. Provisional Application No. 61/917,540, filed Dec. 18, 2013. International Application No. PCT/IB2014/0669421 and U.S. Provisional Application No. 61/917,540 are incorporated herein.

FIELD OF THE INVENTION

This invention relates to the field of light emitting devices, and in particular to a flexible substrate with a patterned conductive layer for mounting an array of light emitting devices.

BACKGROUND OF THE INVENTION

The ever expanding use of semiconductor light emitting devices has produced a highly competitive market for these devices in a variety of configurations. In this market, performance and price are often significant for providing product distinction among vendors.

To achieve high light output intensity, an array of light emitting devices is typically used. Such arrays may be configured in a variety of circuit configurations. Series configurations may be used to provide a uniform current to each device, whereas parallel configurations may be used to allow the use of a low voltage supply. Series-parallel configurations may be used to achieve a particular combination of performance features.

Conventionally, a patterned conductive layer is formed on a substrate, such as a printed circuit board with a conductive layer that is etched to create the desired interconnections between the devices that will be mounted on the board. Flexible substrates may also be used, with the desired interconnections formed by etching or by printing conductive ink on the substrate. Other forms of substrates and patterned conductive interconnections may also be used.

Each different circuit configuration requires a different pattern of conductive traces (different 'layouts'). This requires the creation of different layout masks for etching, or different print patterns for printing each different pattern. In addition to the added design costs for developing each different pattern, the variety of patterns often precludes the economies of scale available for large production quantities.

SUMMARY OF THE INVENTION

It would be advantageous to provide a substrate with a patterned conductive layer that can be modified to provide a variety of circuit configurations. It would further be advantageous to provide the modifications using a simple process that can be applied independent of the production of the substrate.

To better address one or more of these concerns, in an embodiment of this invention, the patterned conductive layer includes pads for mounting an array of LEDs, conductive strips, and conductive tabs that couple the conductive strips to the pads. The desired circuit configuration is created by removing select tabs by punching holes in a flexible substrate. In some embodiments, the patterned conductive layer is arranged to permit each LED to be mounted in either of two mirrored orientations, and in some embodiments, the patterned conductive layer is arranged to permit a separation between LEDs that is not predefined by the pattern. In some embodiments, the unmodified patterned conductive layer is arranged to provide a parallel circuit configuration, and the modified patterned conductive layer is arranged to provide a series or series-parallel configuration.

By providing a configurable substrate, economies of scale can be obtained without regard to the eventual configuration. By providing a simple technique for removing portions of the patterned conductive layer, such as punching or otherwise severing the flexible circuit, the modifications may be performed by each purchaser of the configurable substrate, independent of the provider of the configurable substrate. In like manner, the configurable substrate enables rapid prototyping of potential circuit designs, to evaluate the performance of an array of LEDs that are interconnected using such circuit designs.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

Figure 1A:
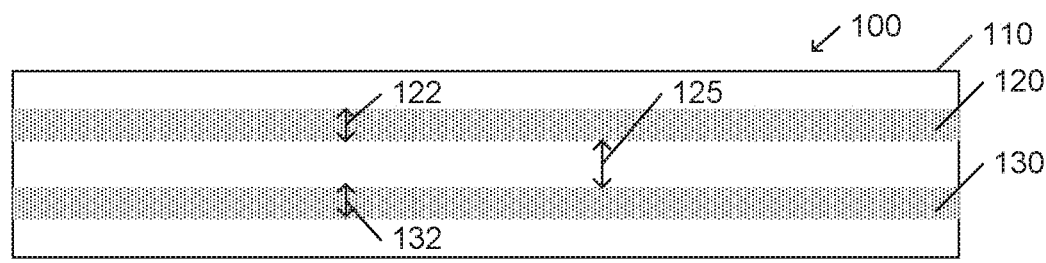
FIGS. 1A-1E illustrate an example substrate with a patterned conductive layer that may be configured to provide a parallel arrangement of an array of light emitting devices, and a serial arrangement.
Figure 1B:
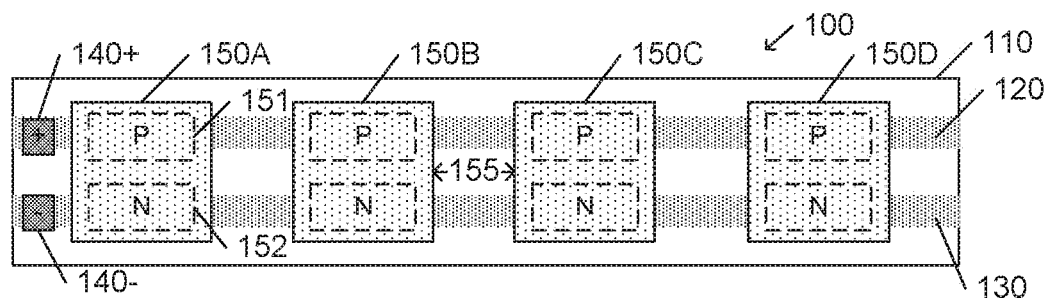
Figure 1C:
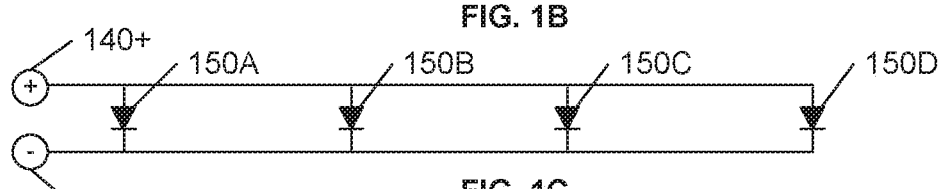
Figure 1D:
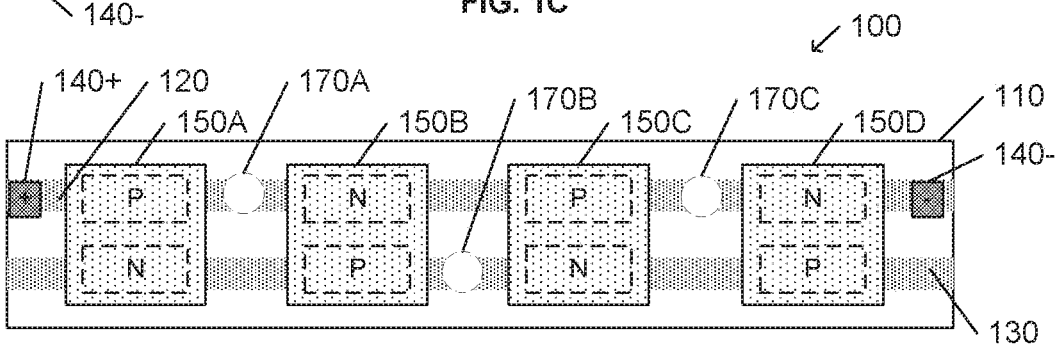
Figure 1E:
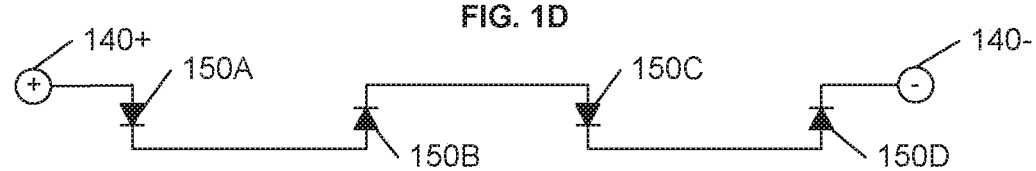

FIGS. 1A-1E illustrate a substrate 100 with a patterned conductive layer that may be configured to provide a parallel arrangement of an array of light emitting devices (FIGS. 1B-1C), and a serial arrangement (FIGS. 1D-1E).

As illustrated in FIG. 1A, the patterned conductive layer includes conductive strips 120, 130 upon a substrate material 110. The lateral extent of the substrate 100, and thereby substrate material 110 and strips 120, 130, is not fixed, and may be sized to accommodate the number of light emitting devices that are to be mounted on the substrate 100 for any particular purpose.

The substrate material 110 may be rigid or flexible, although the principles of this invention are particularly well suited for a flexible substrate material 110. On a flexible substrate material 110, such as a thin insulating polymer film, the conductive strips may be formed by etching metal foil cladding (normally of copper) from polymer bases, plating metal or printing of conductive inks upon polymer bases, and other conventional processes.

In an example embodiment using a flexible substrate material 110, the substrate 100 may be provided on a continuous roll, and cut to size for each different application. Of particular note, such a roll may be provided by the producer of the substrate 100, and cut to size at the purchaser's locale, using common tools such as a knife or scissor.

In a typical application, the substrate 100 is designed to accommodate a particular family of light emitting devices with a well-defined pair of conductive pads for providing external power to each device. The width 122, 132 of each of the conductive strips 120, 130 and the space 125 between the conductive strips 120, 130 are sized to accommodate the mounting of the light emitting devices via these conductive pads. In a preferred embodiment, the strips 120, 130 accommodate the mounting of the light emitting devices in either of two mirrored orientations, as detailed below; accordingly, the widths 122, 130 of the strips 120, 130 may be equal for some embodiments.

FIG. 1B illustrates the mounting of an array of four light emitting devices 150A-150D (collectively, devices 150) upon the substrate 100. In this example configuration, the P-conductive pad 151 of each device 150 is mounted upon the conductive strip 120, and the N-conductive pad 152 of each device 150 is mounted upon the conductive strip 130, thereby forming a parallel circuit arrangement, as illustrated in FIG. 1C. In operation, an external power source is coupled to the circuit via connections 140+, 140− to the strips 120, 130, respectively.

The light emitting devices 150 may be mounted on the strips 120, 130 using any of a variety of conventional techniques, including soldering or using a conductive adhesive to couple the pads 151, 152 to the strips 120, 130, respectively. In like manner, the external connection 140+, 140− to the strips 120, 130 may be via a wire-attach process, via the use of connectors that clamp onto the substrate 100, via the attachment of rigid pins to the strips 120, 130, that are plugged into a power source, and so on.

Of particular note, in the arrangement of FIG. 1B, each of the light emitting devices 150 may be any light emitting device with pads that are accommodated by the size and spacing of the strips 120, 130. In some embodiments, they may all be of the same type or color emission; in other embodiments, they may be a mix of types or color emissions. Although the strips 120, 130 are illustrated as having a width 122, 132 that corresponds to the width of the pads 151, 152 of the light emitting devices 150, one of skill in the art will recognize that substantially wider widths 122, 132 may accommodate a larger variety of light emitting device sizes.

In the alternative strips 120, 130 may include several parallel strips that can be used collectively as one large strip or to accommodate a variety light emitting device sizes or a variety of pad arrangements. In these embodiments, connections may be made or broken to configure the parallel strips.

Also of note, the spacing 155 between light emitting devices 150 is not constrained by the pattern of conductors 120, 130 of the substrate 100, and may be selected based on each particular application. For example, in an arrangement for providing a ring of light sources around the perimeter of an object, the number of, and the spacing between the light emitting devices 150 may be based on the angular width of the light emission pattern (field of view) of each device, so that no 'dark spots' are produced.

FIG. 1D illustrates the use of the same substrate 100 to provide a different circuit configuration of the array of light emitting devices 150.

In the example of FIG. 1D, a combination of select 'breaks' 170A-170C (collectively, breaks 170) in the conductive strips 120, 130 and select orientations of the light emitting devices 150 provides a series circuit configuration of the light emitting devices 150.

Light emitting device 150A is mounted in a first orientation, with its P-pad coupled to the conductive strip 120, and its N-pad coupled to the conductive strip 130. The light emitting device 150B is mounted in a second, mirrored, orientation, with its P-pad coupled to the conductive strip 130, and its N-pad coupled to the conductive strip 120.

A break 170A is introduced in the conductive strip 120, between devices 150A and 150B, for example, by punching a hole through the strip and underlying flexible substrate. This break decouples the P-pad of device 150A and the N-pad of device 150B, resulting in a series connection of the devices 150A-150B. Current will flow from 150A P-pad, through 150A, to 150A N-pad, to 150B P-pad, through 150B, to 150B N-pad.

In like manner, device 150C is oriented in the first orientation (P-Pad to strip 120), and device 150D is oriented in the second, mirrored orientation (P-Pad to strip 130), and breaks 170B, 170C decouple the P-pad of device 150B from the N-pad of device 150C, and the P-pad of device 150C from the N-pad of device 150D, placing devices 150C and 150D in series with the aforementioned series connection of devices 150A and 150D, as illustrated in FIG. 1E. External power is coupled to this series arrangement via connections 140+ and 140−.

One of skill in the art will recognize that alternative circuit configurations may be provided via different breaks in the conductive strips 120, 130 and different orientation of the light emitting devices 150. For example, breaks 170A and 170C may be omitted, devices 150A and 150B may both be placed in the first orientation (P-pads to strip 120), and devices 150C and 150D may both be placed in the second orientation (P-pads to strip 130), which will provide a parallel arrangement of devices 150A-150B in series with a parallel combination of devices 150C-150D. Other configurations are also feasible.

The breaks 170 may be introduced using any number of a variety of techniques, depending upon the materials used for forming the substrate 100, the tools available for introducing the breaks, and so on. In a simple scenario of a flexible substrate material 110, a simple manual or automated punch-tool may be used to introduce each break in the conductive strips 120, 130. Alternatively, manual razor-cuts may be used to remove select sections of the strips 120, 130 in the substrate. For larger volume applications, a numerical-control (NC) machine may be also programmed to create the selected breaks via drilling or other actions. The breaks 170 may extend through the substrate material 110, but need only be formed such that current does not flow from one side of the break 170 to the other. Although each break 170 is illustrated as being between the light emitting devices, one of skill in the art will recognize that the break 170 may be introduced before the light emitting devices 150 are mounted, and may be situated beneath the mounted light emitting devices 150, allowing a reduced spacing between the devices 150.

Of particular note, as with the example of FIG. 1B, the creation of the selected breaks, the mounting of the light emitting devices, the cutting of the substrate to size, and providing connections for an external source, may be performed by the purchaser of 'bulk' substrate 100, independent of the production of the substrate 100. This allows the producer of the substrate 100 to produce the substrate 100 in large quantities, while allowing the user of the substrate 100 to purchase and configure the substrate 100 based on the requirements for each different application.

Figure 2A:
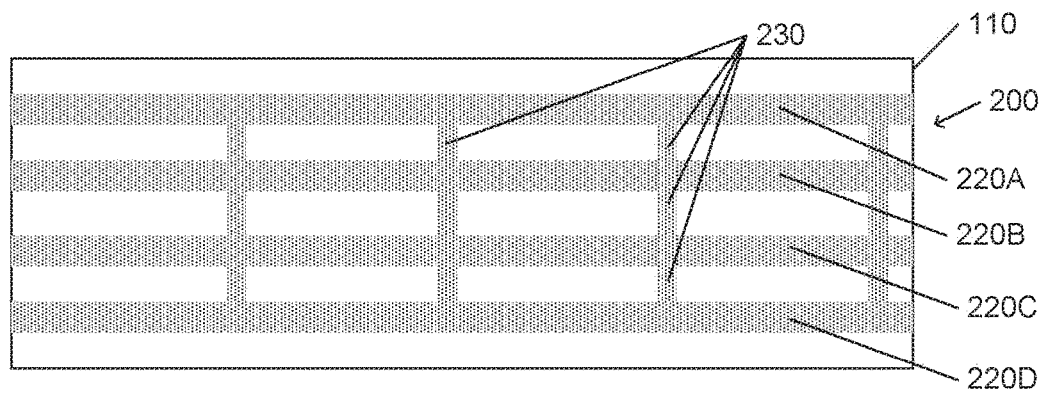
FIGS. 2A-2C illustrate an example substrate with a patterned conductive layer that may be configured to facilitate series-parallel arrangements of an array of light emitting devices.
Figure 2B:
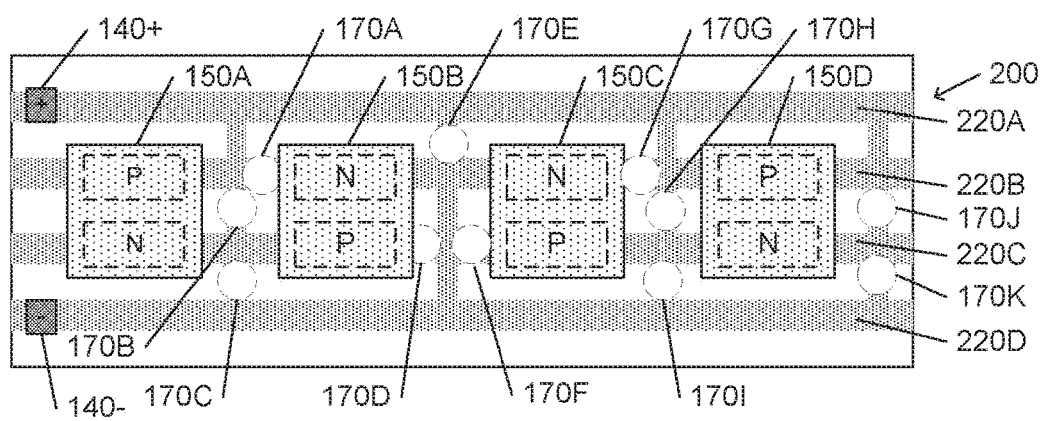
Figure 2C:
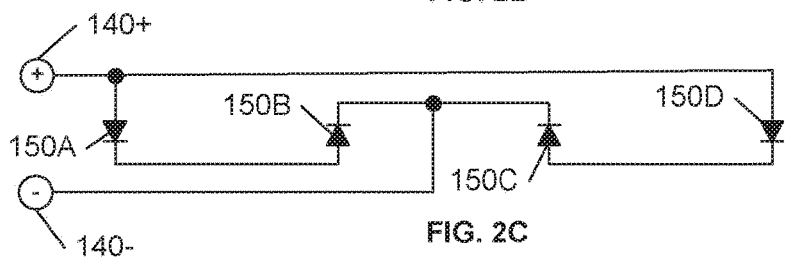

FIG. 2A-2C illustrate another substrate 200 with patterned conductive layer that facilitates series-parallel arrangements of an array of light emitting devices.

The patterned conductive layer on the substrate material 110 includes a plurality of horizontal strips 220A-220D (collectively, strips 220), with vertical tabs 230 interconnecting these strips at regular intervals. For ease of reference, the term "tab" is used herein to indicate a conductive element between two conductors that may be severed so as to isolate the conductors on either side of the tab. As in the previous figures, the substrate material 110 may be a flexible polymer substrate, and the conductive layer may be etched metal, conductive ink, and so on.

Like the conductive strips 120, 130 in FIGS. 1A-1E, two of the conductive strips 220B, 220C are situated to allow for the mounting of light emitting devices via their conductive tabs in either of two mirrored orientations. As contrast to the conductive strips 120, 130 in FIG. 1B, which may be used without the introduction of breaks, the conductive strips 220A-220D are in contact with each other, via the tabs 230, and therefore breaks must be created in order for the conductor pattern to form a circuit for operating the light emitting devices.

FIG. 2B illustrates the mounting of four light emitting devices 150A-150D on the center pair of conductor strips 220B, 220C, and select breaks 170 (labeled 170A-170K). Breaks 170A-170E create a series connection between the light emitting devices 150A and 150B. Breaks 170E-170K create a series connection between light emitting devices 150D and 150C. The conductive strip 220A couples the P-pads of devices 150A and 150D to the connector 140+, and the conductive strip 220D couples the N-pads of devices 150B and 150C to the connector 140−, for coupling to an external power source.

This combination of select breaks 170A-170K and select orientations of the devices 150 provides the illustrated series-parallel circuit illustrated in FIG. 2C. One of skill in the art will recognize that a variety of different circuits may be formed using the substrate 200. As in the example of FIG. 1A, the lateral extent of the substrate 200 is not pre-defined, and may be sized to accommodate as many light emitting devices as the application requires.

Figure 3A:
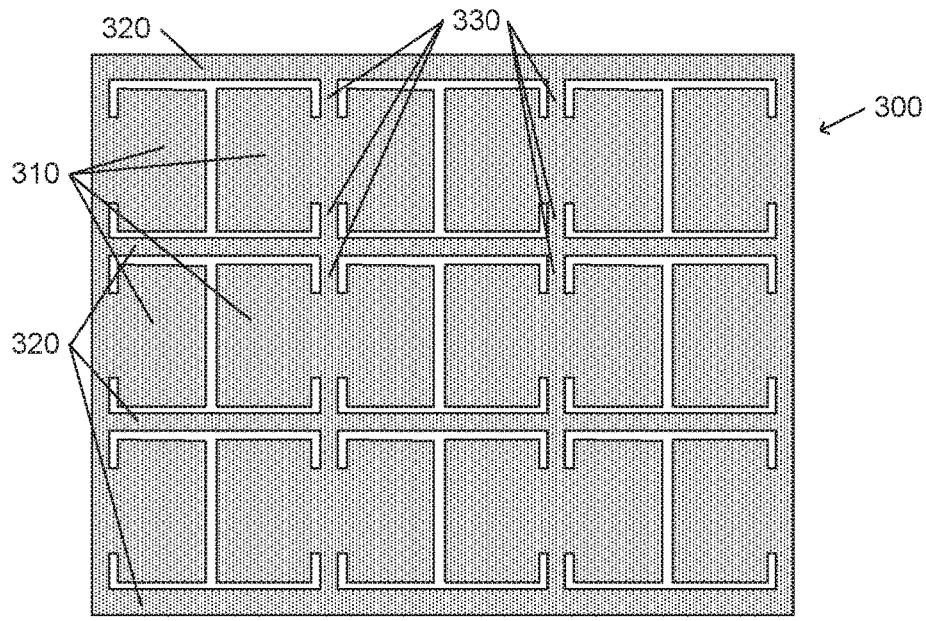
FIGS. 3A-3C illustrate an example substrate with a patterned conductive layer that facilitates a two dimensional arrangement of an array of light emitting devices that may be configured in a variety of different circuit arrangements.
Figure 3B:
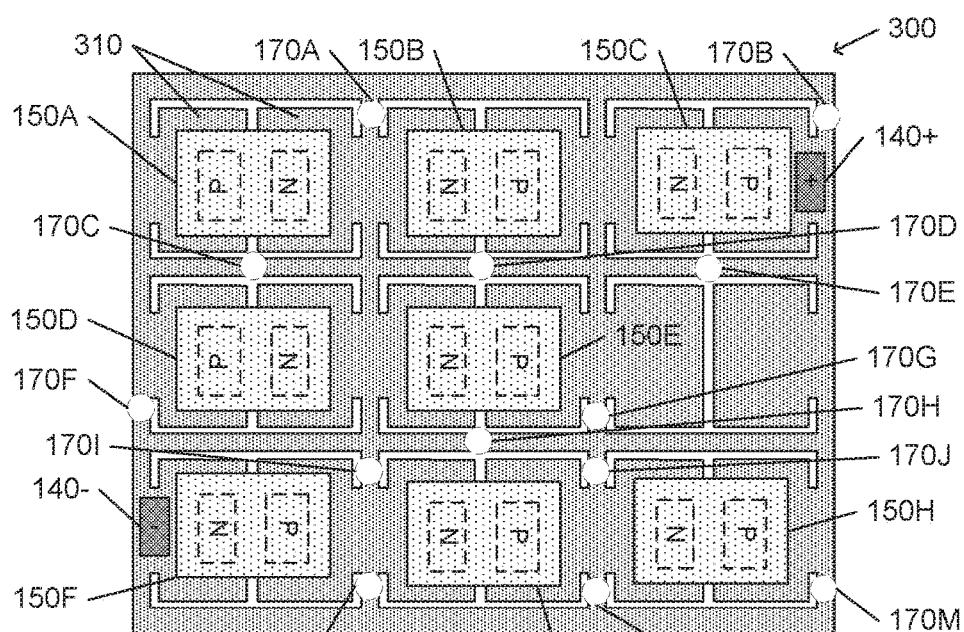
Figure 3C:
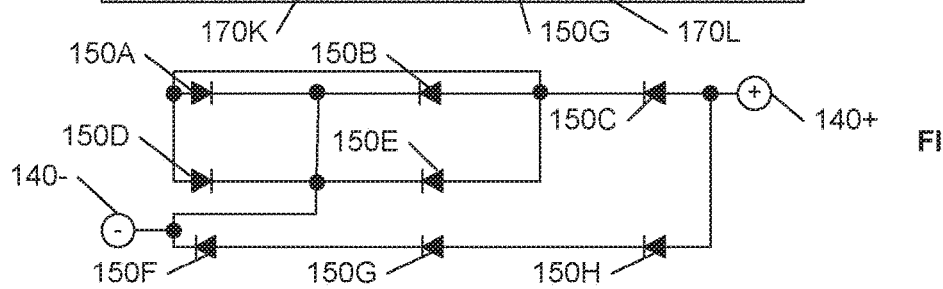

FIGS. 3A-3C illustrate a substrate 300 with a patterned conductive layer that facilitates a two dimensional arrangement of an array of light emitting devices.

The patterned conductive layer includes pads 310 for mounting the light emitting devices, conductive strips 320, and conductive tabs 330 that couple the pads 310 to the strips 320. As in the example of FIG. 2A, all of the conductive elements on the substrate 110 are coupled together, and breaks must be introduced to form an operational circuit configuration for the light emitting devices.

FIG. 3B illustrates an example mounting of light emitting devices 150A-150H and select breaks 170 (labeled 170A-170M) that provides the illustrated circuit arrangement illustrated in FIG. 3C.

The breaks 170B, 170E, 170H, and 170M isolate the positive external connection 140+ from the negative external connection 140−, and couple the P-pads of devices 150C and 150H to the connection 140+. The breaks 170I-170L place the devices 150F, 150G, and 150H in series between the connections 140+ and 140−.

The breaks 170A and 170C-170G result in a parallel connection of devices 150A, 150B, 150D, and 150E. The P-pads of this parallel combination are coupled to the N-pad of device 150C, placing this parallel connection in series with device 150C, from connection 140+ to 140−.

Although the example substrate 300 illustrates an arrangement for mounting a 3×3 array of light emitting devices, one of skill in the art will recognize that both the horizontal and vertical extent of the substrate 300 may be larger or smaller than illustrated. In an example embodiment, the substrate 300 may be provided on a roll or a sheet containing hundreds or thousands of mounting locales, and the purchaser may slice the roll or sheet in either or both directions to form the desired two-dimensional substrate for the particular application.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein other elements are also mounted on the patterned conductive layer, such as ESD (ElectroStatic Discharge) protection devices, and others.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A method comprising:
    providing a flexible substrate including a patterned conductive layer comprising a first conductive strip and a second conductive strip, the first conductive strip and second conductive strip each comprising a plurality of parallel strips;
    mounting a first light emitting device (LED) and a second LED adjacent to the first LED on the flexible substrate with a first spacing between the first LED and the second LED such that conductive pads of the first LED and the second LED are mounted onto a same first set of parallel strips of the first and second conductive strips; and
    mounting a third LED and a fourth LED adjacent to the third LED on the flexible substrate with a second spacing between the third LED and the fourth LED, such that conductive pads of the third LED and the fourth LED are mounted onto a same second set of parallel strips of the first and second conductive strips where the first set of parallel strips is different than the second set of parallel strips.

2. The method of claim 1, wherein the substrate is a flexible polymer substrate.

3. The method of claim 1, wherein the first, second, third, and fourth LEDs are each self-supporting.

4. The method of claim 1, further comprising removing at least a portion of the patterned conductive layer to form a circuit based on the breaks created by removing at least a portion of the patterned conductive layer.

5. The method of claim 4, wherein the removing of at least the portion of the patterned conductive layer includes piercing the flexible substrate at one or more select locations.

6. The method of claim 4, further comprising arranging the first conductive strip and the second conductive strip such that an original circuit without the removal of the portion of the patterned conductive layer of the portion of the patterned conductive layer provides at least one parallel circuit arrangement of LEDs, and the circuit after the removal provides at least one series circuit arrangement of LEDs.

7. The method of claim 4, further comprising providing conductive tabs that couple the first conductive strip and the second conductive strip and the removal of the portion of the patterned conductive layer includes removal of at least one of the conductive tabs.

8. The method of claim 4, wherein the circuit formed by the removal of the portion of the patterned conductive layer includes at least a series-parallel arrangement of LEDs.

* * * * *